(12) United States Patent
Miki

(10) Patent No.: US 10,777,643 B2
(45) Date of Patent: Sep. 15, 2020

(54) METHOD FOR MANUFACTURING SEMICONDUCTOR DEVICE

(71) Applicant: Mitsubishi Electric Corporation, Tokyo (JP)

(72) Inventor: Kohei Miki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/547,461

(22) Filed: Aug. 21, 2019

(65) Prior Publication Data

US 2019/0378897 A1    Dec. 12, 2019

Related U.S. Application Data

(62) Division of application No. 15/897,180, filed on Feb. 15, 2018, now abandoned.

(51) Int. Cl.
| | | |
|---|---|---|
| *H01L 29/778* | (2006.01) | |
| *H01L 29/20* | (2006.01) | |
| *H01L 29/66* | (2006.01) | |
| *H01L 29/205* | (2006.01) | |
| *H01L 29/40* | (2006.01) | |

(52) U.S. Cl.
CPC ........ *H01L 29/2003* (2013.01); *H01L 29/205* (2013.01); *H01L 29/66462* (2013.01); *H01L 29/778* (2013.01); *H01L 29/7786* (2013.01); *H01L 29/401* (2013.01)

(58) Field of Classification Search
CPC ........... H01L 29/66462; H01L 29/7786; H01L 29/7787
See application file for complete search history.

(56) References Cited

U.S. PATENT DOCUMENTS

| | | | |
|---|---|---|---|
| 9,123,791 B2* | 9/2015 | Curatola | H01L 29/7786 |
| 2004/0189173 A1 | 9/2004 | Chowdhury et al. | |
| 2005/0077541 A1* | 4/2005 | Shen | H01L 29/7787 |
| | | | 257/194 |
| 2006/0019435 A1 | 1/2006 | Sheppard et al. | |
| 2006/0186422 A1* | 8/2006 | Gaska | H01S 5/34333 |
| | | | 257/96 |

(Continued)

FOREIGN PATENT DOCUMENTS

| | | |
|---|---|---|
| JP | 2004-297070 A | 10/2004 |
| JP | 5396911 B2 | 1/2014 |

(Continued)

OTHER PUBLICATIONS

D. J. Meyer et al., "N-polar n+ GaN cap development for low ohmic contact resistance to inverted HEMTs," Phys. Status Solidi C 9, No. 3-4, 894-897 (2012). (Year: 2012).*

*Primary Examiner* — Meiya Li
*Assistant Examiner* — Peter M Albrecht
(74) *Attorney, Agent, or Firm* — Studebaker & Brackett PC

(57) ABSTRACT

A semiconductor device includes: a semiconductor substrate; a buffer layer provided on the semiconductor substrate; a GaN channel layer provided on the buffer layer; an AlGaN electron travel layer provided on the GaN channel layer; a GaN cap layer provided on the AlGaN electron travel layer, having a nitrogen polarity, and on which a plurality of recesses are formed; and a gate electrode, a source electrode and a drain electrode provided in each of the plurality of recesses.

4 Claims, 2 Drawing Sheets

(56) References Cited

U.S. PATENT DOCUMENTS

| | | | |
|---|---|---|---|
| 2008/0023706 A1* | 1/2008 | Saito | H01L 29/7787 |
| | | | 257/76 |
| 2013/0026450 A1* | 1/2013 | Park | H01L 29/41725 |
| | | | 257/24 |
| 2013/0240897 A1 | 9/2013 | Imada | |
| 2014/0097433 A1* | 4/2014 | Negoro | H01L 29/66462 |
| | | | 257/51 |
| 2014/0097468 A1 | 4/2014 | Okita et al. | |
| 2017/0092752 A1 | 3/2017 | Lu et al. | |

FOREIGN PATENT DOCUMENTS

| | | | |
|---|---|---|---|
| JP | 2016-187025 A | | 10/2016 |
| JP | 2016187025 A | * | 10/2016 |
| WO | 2006/013698 A1 | | 2/2006 |
| WO | 2013/008422 A1 | | 1/2013 |

* cited by examiner

METHOD FOR MANUFACTURING SEMICONDUCTOR DEVICE

CROSS-REFERENCE TO RELATED APPLICATIONS

This application is a Divisional of U.S. patent application Ser. No. 15/897,180 filed Feb. 15, 2018, which claims benefit of priority to Japanese Patent Application No. 2017-105731 filed May 29, 2017, the entire content of which is incorporated herein by reference.

BACKGROUND OF THE INVENTION

Field

The present invention relates to a GaN-based semiconductor device used for high speed, high frequency communication and a method for manufacturing the same.

Background

In an AlGaN/GaN-HEMT, a GaN cap layer is provided on a GaN channel layer and an AlGaN electron travel layer to suppress a current collapse phenomenon (e.g., see JP 5396911 B2). As the GaN cap layer becomes thicker, it is possible to suppress the current collapse phenomenon better, but this causes a region where an electrode is formed to become thicker as well. Thus, an electron concentration of a 2 DEG decreases, contact resistance between source and drain electrodes, that is, element resistance increases, causing a high frequency characteristic to deteriorate. As a solution to this problem, a structure in which a gate is formed in a recessed part is generally proposed (e.g., see WO 2013/008422 A1). However, damage to the 2 DEG caused by dry etching results in a problem that an operation current decreases and a leakage current increases, and such a structure is insufficient as a solution to the problem.

SUMMARY

A conventional GaN-HEMT has a trade-off relationship between a high frequency characteristic and a current collapse phenomenon. For this reason, the layer thickness of the GaN cap layer needs to be designed within a current collapse phenomenon tolerable range, which results in a problem that a sufficient high frequency characteristic cannot be demonstrated.

The present invention has been implemented to solve the above-described problem and it is an object of the present invention to provide a semiconductor device capable of demonstrating a sufficient high frequency characteristic while suppressing a current collapse phenomenon and a method for manufacturing the same.

A semiconductor device according to the present invention includes: a semiconductor substrate; a buffer layer provided on the semiconductor substrate; a GaN channel layer provided on the buffer layer; an AlGaN electron travel layer provided on the GaN channel layer; a GaN cap layer provided on the AlGaN electron travel layer, having a nitrogen polarity, and on which a plurality of recesses are formed; and a gate electrode, a source electrode and a drain electrode provided in each of the plurality of recesses.

According to the present invention, the gate electrode, the source electrode and the drain electrode are formed in each of the plurality of recesses formed in the GaN cap layer. In this way, even when the GaN cap layer is thickened, the element resistance is not affected, and it is thereby possible to demonstrate a sufficient high frequency characteristic while suppressing a current collapse phenomenon.

Other and further objects, features and advantages of the invention will appear more fully from the following description.

DESCRIPTION OF EMBODIMENTS

Figure 1:
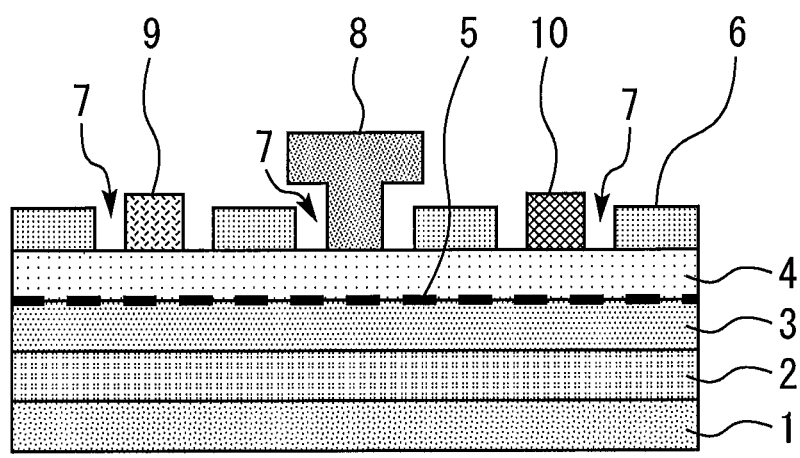
FIG. 1 is a cross-sectional view illustrating a semiconductor device according to an embodiment of the present invention.

FIG. 1 is a cross-sectional view illustrating a semiconductor device according to an embodiment of the present invention. This semiconductor device is a GaN-HEMT. A semiconductor substrate 1 is a SiC substrate in which a GaN-based semiconductor film is allowed to grow. A buffer layer 2 for GaN growth made of GaN or AlN is formed on the semiconductor substrate 1.

A GaN channel layer 3 is formed on the buffer layer 2. An AlGaN electron travel layer 4 is formed on the GaN channel layer 3. A 2 DEG (two-dimensional electron gas layer) 5 is formed between the GaN channel layer 3 and the AlGaN electron travel layer 4.

A GaN cap layer 6 is formed on the AlGaN electron travel layer 4. The GaN cap layer 6 has not a gallium polarity but a nitrogen polarity, and suppresses current collapse. Part or a whole of the GaN cap layer 6 is removed and a plurality of recesses 7 are formed. A gate electrode 8, a source electrode 9 and a drain electrode 10 are formed in each of the plurality of recesses 7.

Figure 2:
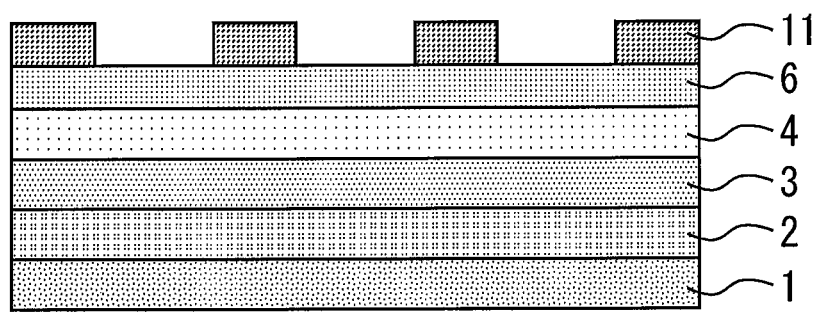
FIGS. 2 to 4 are cross-sectional views illustrating a manufacturing method for the semiconductor device according to the embodiment of the present invention.
Figure 3:
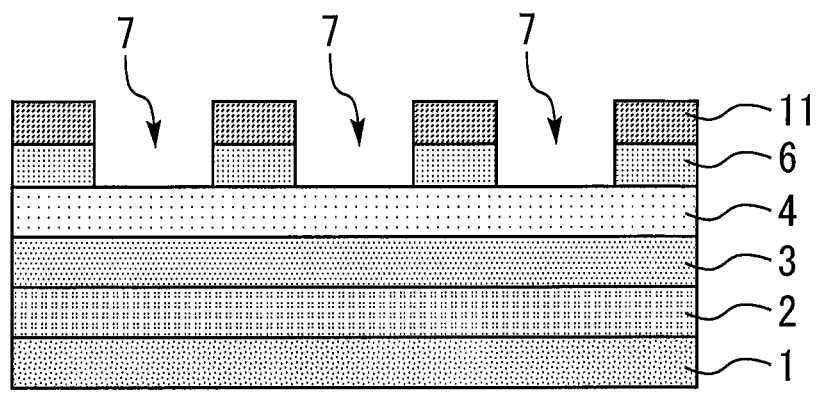
Figure 4:
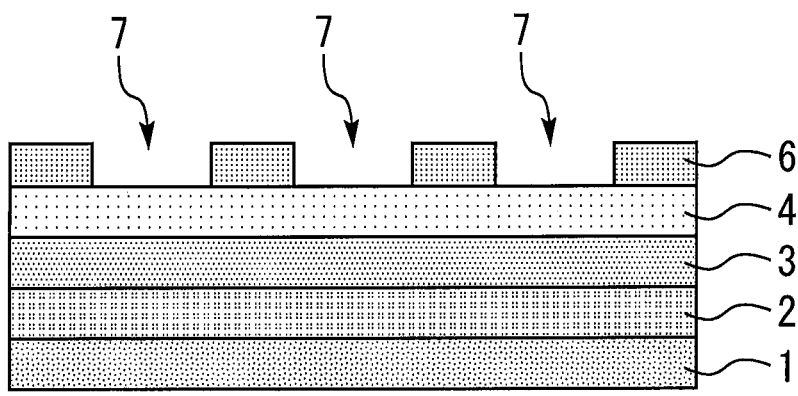

Next, manufacturing steps of the semiconductor device according to the present embodiment will be described. FIGS. 2 to 4 are cross-sectional views illustrating a manufacturing method for the semiconductor device according to the embodiment of the present invention. First, as shown in FIG. 2, the buffer layer 2, the GaN channel layer 3 and the AlGaN electron travel layer 4 are formed in order on the semiconductor substrate 1 using MOCVD. Next, the GaN cap layer 6 with a nitrogen polarity is formed. Next, a resist mask 11 for recess formation is formed on the GaN cap layer 6 using photolithography.

Next, as shown in FIG. 3, using the AlGaN electron travel layer 4 as an etching stop layer, the GaN cap layer 6 is selectively wet-etched down to the AlGaN electron travel layer 4 using KOH having a concentration on the order of 50% at a temperature of 100° C. or higher to form the plurality of recesses 7. Next, as shown in FIG. 4, the resist mask 11 is removed using an organic solvent or a resist stripping agent. After that, the gate electrode 8, the source electrode 9 and the drain electrode 10 are formed respectively in the plurality of recesses 7 using a vapor deposition method. The semiconductor device according to the present embodiment is manufactured in the steps as described so far.

As described above, according to the present embodiment, the gate electrode 8, the source electrode 9 and the drain electrode 10 are formed in each of the plurality of recesses 7 formed in the GaN cap layer 6. In this way, even when the GaN cap layer 6 is thickened, the element resistance is not affected, and it is thereby possible to demonstrate a sufficient high frequency characteristic while suppressing a current collapse phenomenon.

Use of KOH allows the GaN cap layer 6 to be etched free of damage down to the AlGaN electron travel layer 4 which is an etching stop layer. Instead of the resist mask 11, an insulating film such as SiN or SiO or a metal film such as TiW can also be used as a mask when etching the GaN cap layer 6 using KOH. In such a case, those films are patterned through dry etching using a patterned resist mask. After forming the plurality of recesses 7 with KOH using those films as masks, the films are removed using a chemical liquid such as BHF (buffered hydrofluoric acid).

Note that at least one of MBE, sputtering, plasma CVD and vapor deposition method is used as the film formation method for the buffer layer 2, the GaN channel layer 3, the AlGaN electron travel layer 4 and the GaN cap layer 6. The material of the semiconductor substrate 1 is not limited to SiC, but may be Si, GaN, sapphire ($Al_2O_3$) or GaAs. Although the GaN cap layer 6 has a nitrogen polarity, the other layers may have either a nitrogen polarity or a gallium polarity.

Obviously many modifications and variations of the present invention are possible in the light of the above teachings. It is therefore to be understood that within the scope of the appended claims the invention may be practiced otherwise than as specifically described.

The invention claimed is:

1. A method for manufacturing a semiconductor device, comprising:
    forming a buffer layer on a semiconductor substrate;
    forming a GaN channel layer on the buffer layer;
    forming an AlGaN electron travel layer on the GaN channel layer;
    forming a GaN cap layer on the AlGaN electron travel layer, the GaN cap layer having a nitrogen polarity;
    using the AlGaN electron travel layer as an etching stop layer and using potassium hydroxide (KOH) to etch, in a single wet etching step, the GaN cap layer to form a plurality of recesses; and
    forming a gate electrode, a source electrode, and a drain electrode in the plurality of recesses such that the GaN cap layer separates every one of the gate electrode, the source electrode, and the drain electrode from each other,
    wherein a top surface of the AlGaN electron travel layer, being a surface of the AlGaN electron travel layer on which the gate electrode, the source electrode, and the drain electrode are disposed, is formed to be planar,
    each of the gate electrode, the source electrode, and the drain electrode directly contacts the top surface of the AlGaN electron travel layer and is spaced apart from the GaN cap layer such that the top surface of the AlGaN electron travel layer and bottom surfaces of the gate electrode, the source electrode, and the drain electrode, respectively, are coplanar, and
    each of the source electrode and the drain electrode is not overlapped with any portion of the GaN cap layer along a thickness direction of the GaN cap layer.

2. The method for manufacturing the semiconductor device according to claim 1, wherein
    SiN or SiO or TiW is used as a mask when etching the GaN cap layer using the KOH.

3. The method for manufacturing the semiconductor device according to claim 1, wherein
    at least one of molecular beam epitaxy (MBE), sputtering, plasma chemical vapor deposition (CVD), and a vapor deposition method is used as a film formation method for the buffer layer, the GaN channel layer, the AlGaN electron travel layer, and the GaN cap layer.

4. The method for manufacturing the semiconductor device according to claim 2, wherein
    at least one of molecular beam epitaxy (MBE), sputtering, plasma chemical vapor deposition (CVD), and a vapor deposition method is used as a film formation method for the buffer layer, the GaN channel layer, the AlGaN electron travel layer, and the GaN cap layer.

* * * * *